Figure 1:
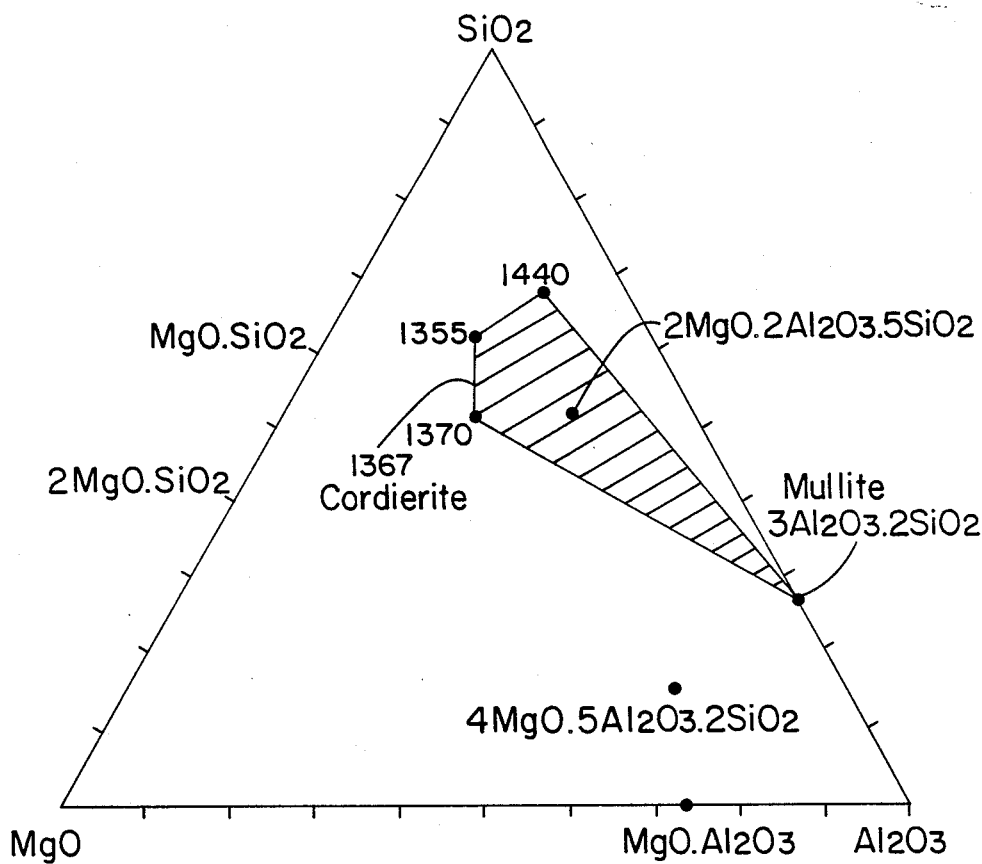

United States Patent [19]

Oliver et al.

[11] Patent Number: 4,915,899

[45] Date of Patent: Apr. 10, 1990

[54] PROCESS FOR CO-SINTERING CONDUCTORS OF COPPER OR COPPER-BASE ALLOYS AND THEIR CERAMIC SUBSTRATE OF CORDIERITE

[75] Inventors: Véronique Oliver; Jean-Louis Guille, both of Strasbourg; Jean-Claude Bernier, Lingolsheim; Claude Drapier, Vaucresson, all of France

[73] Assignee: Pechiney Recherche Groupement d'Interet Economique, Paris, France

[21] Appl. No.: 299,335

[22] Filed: Jan. 23, 1989

[30] Foreign Application Priority Data

Jan. 22, 1988 [FR] France .................................. 88 01136

[51] Int. Cl.⁴ .............................................. B22F 7/02
[52] U.S. Cl. ......................................... 419/8; 419/19; 419/22; 419/54; 75/235; 428/552
[58] Field of Search ...................... 419/5, 8, 6, 22, 19, 419/40, 45, 54, 56; 427/96; 428/552; 75/235

[56] References Cited

U.S. PATENT DOCUMENTS 3,994,430 11/1976 Cusano et al. ...................... 228/122
4,551,357 11/1985 Takeuchi .............................. 427/96

*Primary Examiner*—Stephen J. Lechert, Jr.
*Assistant Examiner*—Ngoclan Mai
*Attorney, Agent, or Firm*—Dennison, Meserole, Pollack & Scheiner

[57] ABSTRACT

The invention comprises a process for co-sintering of conductors of copper or copper-based alloy and a ceramic substrate, the substrate being produced from a ceramic powder of cordierite type, having a sintering temperature of lower than 950° C.

The process comprises the following steps:
(a) shaping of the ceramic substrate from a powder of cordierite type,
(b) deposit of copper on the ceramic substrate, and
(c) co-sintering heat treatment, during which the organic compounds are removed, the copper is regenerated in a reducing atmosphere, and co-sintering of the conductors and the substrate is carried out in a flow of moist inert gas with a plateau at a temperature of between 1065° and 1080° C.

The process according to the invention makes it possible to produce substrates of cordierite with internal and external conductors.

22 Claims, 1 Drawing Sheet

PROCESS FOR CO-SINTERING CONDUCTORS OF COPPER OR COPPER-BASE ALLOYS AND THEIR CERAMIC SUBSTRATE OF CORDIERITE

TECHNICAL FIELD OF THE INVENTION

The invention concerns a process for co-sintering of copper or a copper-base alloy which is a good conductor of electricity, and an insulating ceramic substrate which undergoes sintering at low temperature (below 1100° C.) of cordierite type. It is applied more particularly but no exclusively to the production of hybrid electronic circuits, interconnection circuits or boxes, using procedures referred to as thick-film and multi-layer arrangements.

STATE OF THE PRIOR ART

It is known to produce electronic power circuits on insulating ceramic substrates, for example of alumina, by anchoring the conductor elements to the ceramic substrate by a bond which results from the production of a liquid eutectic Cu-Cu$_2$O (melting point 1065° C.), wetting the alumina substrate with which it probably forms a spinel phase, CuAl$_2$O$_4$, or a compound CuAlO$_2$ (M. WITMER, C.R. BOER. P. GUDMUNDSON and J. CARLSON, J. of Am. Ceram. Soc. 65(3) 149–153, 1982).

It is also known to use a substrate comprising cordierite-based ceramics for the production of insulating substrates, and carriers for integrated circuits and multi-layer circuits. Such ceramics are prepared by sintering a powder which is of a composition that is close to cordierite, at a temperature of the order of 1350° C. and after the addition of sintering agents such as P$_2$O$_5$. Such ceramics are for example described by K. WATANABE and E. GIESS in J. Am. Ceram. Soc. 68(4), C-102, C-103, 1985. It will be recalled that the basic formula of cordierite is 2 MgO, 2 Al$_2$O$_3$, 5 SiO$_2$.

However, at a temperature of 1350° C., the conductor materials which are usually employed in hybrid circuits (copper and silver) are molten and it is generally necessary to use refractory metals or to operate in two stages: sintering of the ceramic substrate at high temperature and then, after cooling, application of the metal conductors, for example in the form of an "ink" which is produced by dispersing micronic metal powder in a liquid medium, and a fresh baking operation at about 1065°/1070° C. to form the compound Cu/Cu$_2$O/Al$_2$O$_3$ which produces the copper-alumina bond. Processes of that kind have been described in particular in U.S. Pat. No. 3,994,430 (General Electric Company); the substrate may be a previously sintered ceramic such as alumina (column 5, FIG. 25) and the conductor may be formed of copper bonded to the alumina in a second step by the formation of a copper-copper oxide eutectic. The application of that process to semiconductor power boxes was described in U.S. patent No 4 129 243 to the same company.

U.S. Pat. No. 4,413,061 (I.B.M. Corp.) proposes using a carrier for multi-layer circuits, comprising a "vitreous ceramic" which is not porous and which can be sintered at a temperature below 1000° C., selected from β-spodumene and cordieriteα, the vitrification of which is promoted by small amounts of additives such as P$_2$O$_5$, ZrO$_2$, SnO, LiO$_2$ and B$_2$O$_3$. Then, in the course of the sintering operation, those additives then give rise to the occurrence of phases which partly cause a deterioration in the electrical, thermal and mechanical properties of the ceramic material.

The present invention seeks to remedy the disadvantages of those processes by providing substrates of cordierite which retain the good electrical and thermal characteristics of that type of ceramic and in respect of which the conductors may be co-sintered at the same time as their ceramic carrier, both when the latter are positioned on the outside surface and when they are interposed between two insulating layers (which is the case with multi-layer arrangements).

SUBJECT OF THE INVENTION

The subject of the invention is a process for co-sintering of a nonprecious conductor metal selected from copper and alloys thereof (for example copper-nickel) and a substrate of ceramic which can be sintered at a temperature lower than the melting point of the metal or the alloy (that is to say 1083° C. in the case of pure Cu). The conductors have to be secured to their carrier when they are disposed on the outside surface, that is to say in that case there must be a metal-ceramic bond, but it may be advantageous to avoid such a bond when they are in an internal position, in particular for high-frequency uses.

The substrate of ceramic material which is selected for carrying the invention into effect is of the "cordierite" type, the basic composition of which is (2MgO, 2Al$_2$O, 5SiO$_2$), being produced by means of a particular process which makes it sinterable at a temperature which is equal to or lower than 950° C. without any sintering additive or adjuvant, of a usable composition which may be between 2MgO, 2Al$_2$O$_3$, 5SiO$_2$ (pure cordierite) and 3Al$_2$O$_3$, 2SiO$_2$(mullite).

The metal or alloy and in particular copper is applied in the form of ink formed by a fine micronic powder dispersed in a liquid medium. The cordierite which can be sintered at low temperature (<950° C.) is produced for example by means of the process described in French patent application FR-A-2 585 015 filed on 16th July 1985 in the name of CNRS, the use as an interconnection substrate in turn having been described in French patent application FR-A-2 585 181 filed on the same date in the name of XERAM but in which the products envisaged do not have any external conductors.

DESCRIPTION OF THE INVENTION

The invention is carried into effect by using the powder produced in accordance with French patent application No 2 585 015 or any equivalent powder which has the following characteristics:
  granulometry of between 0.5 and 10 micrometers
  structure of non-crystallised glass type
  specific surface area of greater than 50 m2/g
  sintering in the amorphous phase at between 800° and 950° C.; densification of at least 95% after 15 minutes at 1050° C., resulting in at least one crystalline phase
  composition 2Al$_2$O$_3$, 2MgO, 5SiO$_2$ (pure cordierite) and any composition between cordierite and 3Al$_2$O$_3$, 2SiO$_2$ (mullite) corresponding to the hatched zone in the ternary diagram Al$_2$O$_3$, MgO, SiO$_2$, FIG. 1.

The operation of shaping the substrate may be carried out in two ways:

the substrate is formed by compression of the powder under a pressure of the order of 150 MPa (between 50 and 400 MPa), and a process of the "doctor blade" type is used to cast a slip of said powder in an organic or aqueous medium comprising at least 35% by weight of mineral powder, the remainder being composed of solvents, binding agents, plasticising agents and dispersing agents of the type usually employed in that process. After evaporation of the solvents or water, that gives a strip of a thickness of between 50 and 300 μm.

It will be recalled that that method is carried into effect under the following conditions: the slip is introduced into a reservoir, one of the sides of which can be displaced vertically so as to form a calibrated opening through which the suspension flows away. The reservoir is positioned on a strip of polished metal or on a polymer film (for example nylon or polyethylene) or on a glass plate. The reservoir slides over that carrier, wherein the movement can be produced either by displacement of the reservoir or by moving the carrier therepast. Regulation of the opening makes it possible to produce strips, the thickness of which after drying is between 20 and 300 μm.

The copper-based conducting ink which is then deposited on the substrate is primarily formed by pigments in powder form which contain copper, a ceramic powder filler, and an organic phase used as a carrier. The copper-containing pigments which after sintering will give the layers their electrical properties are selected from the following three formulae:

P1 : powder of copper (or copper-based alloy) which is not oxidised

P2 : powder of copper (or copper-based alloy) which is partially oxidised

P3 : powder of oxides of copper in one of the forms $Cu_2O$, $CuO$ or a mixture of the two.

Among the copper-based alloys, cupro-nickel containing for example from 0.1 to 10% by weight of nickel has the advantage of having a higher melting point than pure copper, which results in a higher degree of convenience in carrying out the co-sintering heat treatment. Those powders containing copper, having a morphology which is as spherical as possible, are of a controlled granulometry such that the mean size of the grains remains between two limits :

from 0.1 to 6 μm for the powders P1 and P2, preferably between 0.2 and 3 μm and from 0.2 to 10 μm for the powders P3, preferably between 0.5 and 6 μm.

The ceramic powder filler is formed by cordierite having the same characteristics as the powder used for the substrate, the amount introduced being for example between 0.5 and 20% of the mass of copper-based powder and preferably between 1 and 15%.

The amount of pigments based on copper and cordierite powder is between 45 and 80% of the total mass of ink and preferably between 55 and 70%. The organic phase which is composed of solvents, binding agents plasticising agents and dispersing agents of the type usually employed for conducting layers makes it possible to provide the rheological properties necessary for screen printing, it represents from 20 to 55% of the total weight of the ink.

The process for depositing the ink, preferably of screen printing type, is not part of the invention.

After the copper deposit operation, heat treatments have to be applied, which result in the co-sintering effect, the array of parameters defining such treatments depending on the location of the conductors and the nature of the pigment of the ink:

(a) When the product to be produced has only external circuits, the pigment is selected form the three formulae P1 to P3 above and the heat treatment to be carried out is treatment T1 which is defined as follows:

In order to remove the organic components of the ink and the substrate by evaporation and combustion, heating in the air by a slow rise in temperature at a rate which does not exceed 20 $K \cdot h^{-1}$ with at least one plateau of duration which is at least equal to two hours at a temperature between 200° and 500° C. That step results in at least partial oxidation of the metal copper present in the ink, primarily in the state CuO;

after cooling to ambient temperature, regeneration of the copper by heating in a hydrogen atmosphere, preferably with a temperature rise rate of between 100 and 800 $K \cdot h^{-1}$, with the temperature being held at the maximum treatment temperature (between 120° C. and 350° C.) for a period of from 10 minutes to 3 hours and with optional intermediate plateaux; it is also possible to operate in an atmosphere of hydrogen diluted with an inert gas;

the arrangement is subjected to a flow of moist argon (or other inert gas) such as moist $N_2$ or He (dew point 20° C.) by bubbling argon into water and the temperature is raised to 1070° C. at a rate of 720 $K \cdot h^{-1}$ (preferably between 50 and 1000 $K \cdot h^{-1}$); the addition of water to the inert gas may be replaced by the addition of a small amount of oxygen, which is of the order of a few ppm by volume, for example 5;

a plateau at a temperature of between 1065° and 1080° C. with an optimum in the vicinity of 1070° C. and for a period of between 15 minutes and 2 hours; and return to ambient temperature in about 3 hours (preferably between 1 hour and 4 hours).

(b) When the product to be produced is a multi-layer substrate comprising both internal and external conductors, the pigment in the ink is selected from the tree formulae P1 to P3, with preferably an ink of formula P2 for the external conductors and heat treatment of type T2 is used, as follows:

heating in the air at between 200° and 500° C.;

after cooling to ambient temperature, regeneration of the copper by heating in hydrogen, preferably with a temperature rise rate of between 100 and 800 $K \cdot h^{-1}$, with the temperature being held at the maximum treatment temperature for a period of from 10 minutes to 3 hours and with optional intermediate plateaux; it is also possible to operate in an atmosphere of hydrogen diluted with an inert gas;

subjecting the arrangement to a flow of argon (or other inert gas) and a rise in temperature to 950° C. at a rate of 720 $K \cdot h^{-1}$ (preferably between 500 and 1000 $K \cdot h^{-1}$);

a plateau at a temperature of 950° C. (preferably between 900° and 1000° C.) for a period of between 15 minutes and 2 hours in the same atmosphere as that used in the temperature rise phase;

subjecting the arrangement to a flow of neutral gas (for example argon) which is moist (dew point 20° C.) at the end of the plateau;

a rise in temperature to 1070° C. in a neutral and moist gas at a rate which is at least equal to 500 $K \cdot h^{-1}$;

a plateau in the same atmosphere at a temperature of between 1065° and 1080° C. with an optimum in the vicinity of 1070° C. and for a period of between 15 minutes and 2 hours; and return to ambient temperature in about 3 hours (preferably between 1 hour and 4 hours).

All of the above-described solutions are summarised in Table 1; at the same time as a description of the process, they represent examples of use thereof and all result in substrates on which the external conductors are strongly anchored to their carrier while the internal conductors are not bonded to the cordierite, such products being particularly suitable for high-frequency uses as:

the absence of metal-ceramic bond points avoids an increase in the impedance of the internal conductors which do not have compounds of Cu at their surface and which retain a reduced level of surface roughness; and cordierite has a low dielectric constant (less than 5).

TABLE I

| Products to be produced | Type of pigment(ink) | Principal parameters of the heat treatments | | | |
|---|---|---|---|---|---|
| | | Ref. | Nature | Atmosphere | Temperature °C. |
| Substrates comprising only external conductors | P1 P2 P3 | T1 | removal of organic compounds | air | 200 to 500 |
| | | | regeneration of Cu | H2 | 120 to 350 |
| | | | co-sintering | Moist Ar | 1065 to 1080 |
| Multi-layer substrates with internal and external conductors | P1 P2 P3 P3 preferred for external conductor | T2 | removal of organic compounds | Air | 200 to 500 |
| | | | regeneration of Cu | H2 | 120 to 350 |
| | | | co-sintering | Ar | 900 to 1000 |
| | | | | Moist Ar | 1065 to 1080 |

We claim:

1. A process for co-sintering conductors of copper or copper alloy and a ceramic substrate, comprising the steps of:
   (a) shaping a ceramic substrate from a powder consisting essentially of cordierite type ceramic having a sintering temperature lower than 950° C., a specific surface area greater than $50 m^2/g$, and a chemical composition between $2 Al_2O_3 2 MgO 5 SiO_2$, pure cordierite, and $3 Al_2O_3 2 SiO_2$, mullite;
   (b) depositing on an external surface of said substrate a copper-based ink comprising a copper-based powdered pigment and said powder of cordierite type;
   (c) heat-treating said substrate with external deposit in a first phase in an oxidizing atmosphere at a temperature not greater than 500° C. to decompose substantially all organic compounds present in the substrate and/or ink;
   (d) heat-treating said substrate with external deposit in a second phase in a reducing atmosphere at 120° to 350° C. to regenerate copper; and
   (e) heat-treating said substrate with external deposit in a third phase at a temperature plateau at between 1065° and 1080° C. for 15 minutes to 2 hours, at least partially in a flow of moist inert gas for co-sintering, resulting in densification of the cordierite type ceramic of at least 95% with the formation of at least one crystalline phase, and in the formation of a liquid $Cu-Cu_2O$ eutectic from said external deposit which bonds the deposit to the $Al_2O_3$ of the cordierite-type ceramic.

2. A process according to claim 1 wherein the copper is introduced into the ink in the form of a powder based on copper or alloys of copper which is non-oxidised.

3. A process according to claim 1 wherein the copper is introduced into the ink in the form of a powder based on copper or alloy of copper which is partially oxidised.

4. A process according to claim 1 wherein the copper is introduced into the ink in the form of a powder of copper oxide of type $Cu_2O$, CuO or a mixture of the two.

5. A process according to claim 2 or 3 wherein the mean granulometric size of said copper powder is between 0.1 and 6 μm.

6. A process according to claim 4 wherein the means granulometric size of said powder of copper oxides is between 0.2 and 10 μm.

7. A process according to claim 5 wherein said ink contains cordierite-type powder of the same nature as that used for the substrate and in an amount of between 0.5 and 20% of the weight of copper-based pigments.

8. A process according to claim 7 wherein said ink contains an amount of pigments based on copper and cordierite-type powder which is between 45 and 80% of the total mass of ink.

9. A process according to claim 1 wherein said phase for the decomposition of organic compounds is carried out in air by a slow rise in temperature at a rate which does not exceed 20 $K \cdot h^{-1}$ with at least one plateau of a duration which is at least equal to two hours at a temperature between 200° and 500° C.

10. A process according to claim 1 wherein said phase for the regeneration of copper is effected in an atmosphere of hydrogen in pure form or diluted with inert gas at a temperature of between 120° and 350° C., with a rise in temperature of between 100 and 800 $K \cdot h^{-1}$ and with the temperature being held at the treatment temperature for a period of from 10 minutes to 3 hours.

11. A process according to claim 1 wherein said phase of co-sintering is effected with a rise in temperature of between 500 and 100 $K \cdot h^{-1}$.

12. A process according to claim 11 wherein said phase of co-sintering is carried out in a flow of moist argon.

13. A process according to claim 11 wherein said flow of moist inert gas is introduced as from the end of said phase for regeneration of the copper in a reducing atmosphere.

14. A process according to claim 13 for the production of substrates of ceramic comprising only external conductors.

15. A process according to claim 5, wherein the mean granulometric size of said copper powder is between 0.2 and 3 μm.

16. A process according to claim 6, wherein the mean granulometric size of said powder of copper oxides is between 0.5 and 6 μm.

17. A process according to claim 7, wherein the amount of said cordierite-type powder is between 1 and 15% of the weight of copper based pigments.

18. A process according to claim 8, wherein the amount of said pigments and cordierite-type powder is between 55 and 70% of the total mass of the ink.

19. A process according to claim 11, wherein the temperature of said substrate is raised after said second phase to 950° C. in an inert gas, and a flow of said moist inert gas is begun after the temperature has reached 950° C.

20. A process according to claim 17 or 18, wherein said moist inert gas has a dew point of 20° C.

21. A process according to claim 19 for the production of multi-layer substrates of ceramic material comprising internal and external conductors.

22. A process for co-sintering conductors of copper or copper alloy and a ceramic substrate, comprising the steps of:

(a) shaping a plurality ceramic substrates from a powder consisting essentially of cordierite type ceramic having a sintering temperature lower than 950° C., a specific surface area greater than 50m$^2$/g, and a chemical composition between 2 Al$_2$O$_3$2 MgO 5 SiO$_2$, pure cordierite, and 3 Al$_2$O$_3$2 SiO$_2$, mullite;

(b) depositing on each said substrate a copper-based ink comprising a copper-based powdered pigment and said powder or cordierite type;

(c) forming from said substrate a multi-layer structure comprising internal and external conductors.

(d) heat-treating said multi-layer structure in a first phase in an oxidizing atmosphere at a temperature not greater than 500° C. to decompose substantially all organic compounds present in the substrate and/or ink;

(e) heat-treating said multi-layer structure in a second phase in a reducing atmosphere at 120° to 350° C. to regenerate copper;

(f) heat-treating said multi-layer structure in a third phase in an inert gas at a temperature plateau of 900°–1000° C. for 15 minutes to 2 hours; and (g) heat-treating said multi-layer structure in a fourth phase at a temperature plateau of between 1065° and 1080° C. for 15 minutes to 2 hours, at least partially in a flow of moist inert gas, resulting in densification of the cordierite-type ceramic of at least 95% with the formation of liquid Cu-Cu$_2$O eutectic from said at least one external conductor which bonds said external conductor to the Al$_2$O$_3$ of the cordierite-type ceramic, said at least one internal conductor remaining substantially unbonded to a substrate surface.

* * * * *

UNITED STATES PATENT AND TRADEMARK OFFICE
CERTIFICATE OF CORRECTION

PATENT NO. : 4,915,899
DATED : April 10, 1990
INVENTOR(S) : Veronique Oliver et al It is certified that error appears in the above-identified patent and that said Letters Patent is hereby corrected as shown below:

Column 1, line 66, change "$ZrO_2$, SnO, $LiO_2$" to read:
 --$ZrO_2$, $TiO_2$, $SnO_2$, $Li_2O$--.

Column 4, line 43, change "tree" to --three--.

Signed and Sealed this

Third Day of September, 1991

Attest:

HARRY F. MANBECK, JR.

*Attesting Officer*   *Commissioner of Patents and Trademarks*